(12) United States Patent
Varadarajan et al.

(10) Patent No.: US 7,555,687 B2
(45) Date of Patent: Jun. 30, 2009

(54) SEQUENTIAL SCAN TECHNIQUE FOR TESTING INTEGRATED CIRCUITS WITH REDUCED POWER, TIME AND/OR COST

(75) Inventors: Devanathan Varadarajan, Chennai (IN); Senthil Arasu Thirunavukarasu, Coimbatore (IN)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 11/161,016

(22) Filed: Jul. 20, 2005

(65) Prior Publication Data

US 2007/0022338 A1    Jan. 25, 2007

(51) Int. Cl.
    G01R 31/28    (2006.01)
    G06F 17/50    (2006.01)
    G06F 9/45     (2006.01)

(52) U.S. Cl. .............. 714/726; 714/727; 714/729; 716/4; 716/5

(58) Field of Classification Search ............ None
    See application file for complete search history.

(56) References Cited

U.S. PATENT DOCUMENTS

| | | | | |
|---|---|---|---|---|
| 5,623,503 A * | 4/1997 | Rutkowski | ........... | 714/727 |
| 5,724,537 A * | 3/1998 | Jones | ........... | 711/1 |
| 5,748,497 A * | 5/1998 | Scott et al. | ........... | 702/181 |
| 5,774,475 A * | 6/1998 | Qureshi | ........... | 714/726 |
| 6,067,417 A * | 5/2000 | Wise et al. | ........... | 712/18 |
| 6,067,651 A * | 5/2000 | Rohrbaugh et al. | ........ | 714/738 |
| 6,073,265 A * | 6/2000 | Komoda | ........... | 714/738 |
| 6,131,173 A * | 10/2000 | Meirlevede et al. | ........ | 714/726 |
| 6,370,664 B1 * | 4/2002 | Bhawmik | ........... | 714/729 |
| 6,678,849 B1 * | 1/2004 | Shiraishi et al. | ........... | 714/729 |
| 6,708,315 B2 * | 3/2004 | Hosokawa et al. | ........... | 716/4 |
| 6,886,122 B1 * | 4/2005 | Barthel | ........... | 714/727 |
| 6,966,021 B2 * | 11/2005 | Rajski et al. | ........... | 714/726 |
| 7,210,082 B1 * | 4/2007 | Abdel-Hafez et al. | ....... | 714/726 |
| 2002/0184583 A1 * | 12/2002 | Hikone et al. | ........... | 714/726 |
| 2004/0088659 A1 * | 5/2004 | Mori | ........... | 716/2 |
| 2004/0221143 A1 * | 11/2004 | Wise et al. | ........... | 712/300 |
| 2005/0204227 A1 * | 9/2005 | Machimura | ........... | 714/726 |
| 2006/0064616 A1 * | 3/2006 | Rajski et al. | ........... | 714/726 |
| 2006/0075282 A1 * | 4/2006 | Borkenhagen et al. | ........ | 714/5 |
| 2006/0156091 A1 * | 7/2006 | Aipperspach et al. | ....... | 714/718 |
| 2008/0104466 A1 * | 5/2008 | Menon et al. | ........... | 714/727 |

* cited by examiner

*Primary Examiner*—Cynthia Britt
*Assistant Examiner*—Guerrier Merant
(74) *Attorney, Agent, or Firm*—Dawn V. Stephens; Wade James Brady, III; Frederick J. Telecky, Jr.

(57) ABSTRACT

Each portion of an integrated circuit is tested using Automatic test pattern generation (ATPG) technique to detect intra-portion faults. Inter-portion faults are detected by first forming a scan chain containing (a) the memory elements in the fan-out of the inputs to each of said plurality of portions, (b) the memory elements in the fan-in of the outputs of each of said plurality of portions, (c) memory elements connected to combinatorial logic propagating data inputs to the memory elements of (a), and (d) memory elements connected to provide control signals to (a), (b) and (c). Sequential scan tests are then performed on the scan chain thus formed.

8 Claims, 6 Drawing Sheets

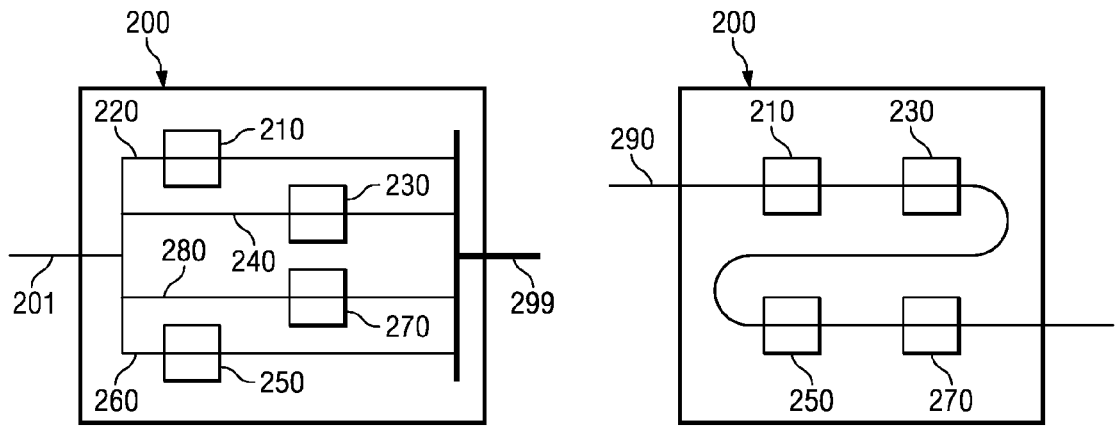
FIG. 2A
*(PRIOR ART)*
FIG. 2B
*(PRIOR ART)*
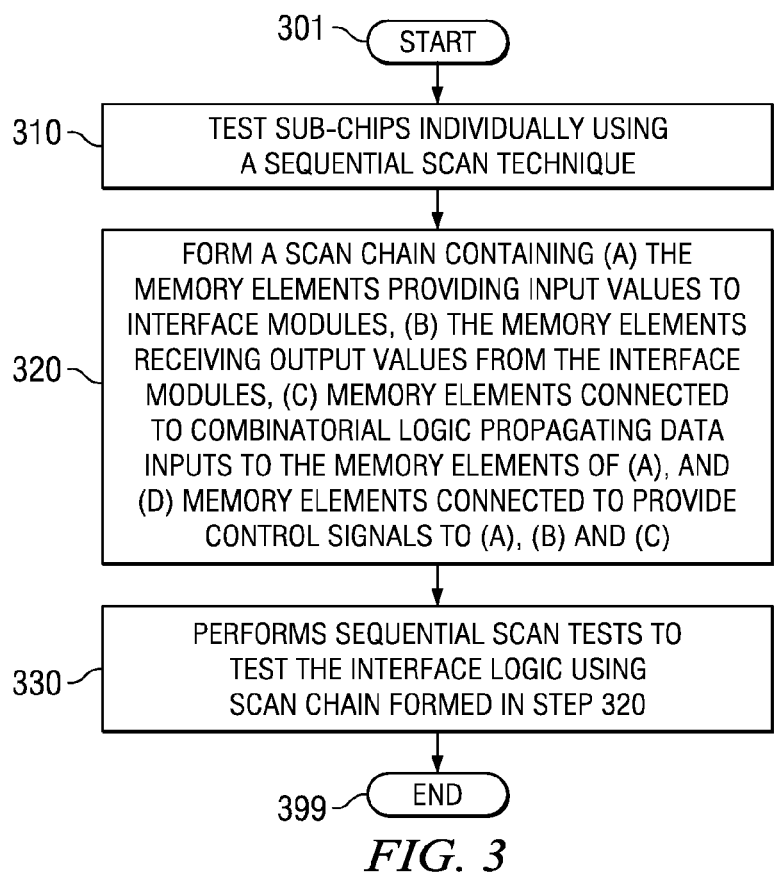
FIG. 3

SEQUENTIAL SCAN TECHNIQUE FOR TESTING INTEGRATED CIRCUITS WITH REDUCED POWER, TIME AND/OR COST

BACKGROUND OF THE INVENTION

1. Field of the Invention

The present invention relates generally to the field of testing of integrated circuits, and more specifically to a sequential scan technique which leads to reduction of one or more of test time, cost and power consumption.

2. Related Art

Sequential scan techniques are often used to test integrated circuits. According to a typical sequential scan technique, integrated circuits are designed to operate in functional mode or test mode. In functional mode, elements in the integrated circuit are connected according to a desired design and to provide a desired utility for which the integrated circuit is primarily designed.

In test mode, the integrated circuit is designed to connect various memory elements (contained in the integrated circuit) such as flip-flops in a sequence referred to as a "scan chain" (i.e., the output of one element is connected as an input to the next element). The first element in the scan chain is generally designed to receive the input bits and the last element of the scan chain is designed to scan out the results of evaluation, as described below.

In a typical scan test scenario, a number of bits in a particular pattern of zeros and ones (scan vector) are sequentially (one bit at every clock cycle) loaded (scanned in) into scan chain through the first element. The number of bits contained in the scan vector generally equals the number of memory elements in a corresponding scan chain.

Once a scan chain is loaded with a scan vector, the elements (generally the combinatorial logic) in the integrated circuit are evaluated based on the scanned in bits. The flip-flops are designed to latch the results of the evaluation, and the bits latched in the scan chain are sequentially scanned out (one bit at every clock cycle) through the last element in the scan chain. The received scan out is compared with an expected scan out corresponding to the scan vector to determine the various faults within the integrated circuit.

Multiple scan chains are present, particularly in very large scale integrated circuits. Each scan chain covers a corresponding portion of the integrated circuit, and thus may need to be tested with a corresponding set of scan vectors. Accordingly, when a scan chain is loaded and tested with a scan vector, a desired controllability (of the internal logic of the portion being tested) and observability (visibility of the corresponding accuracy of operation) of the corresponding portion is obtained.

In general, such tests need to be performed meeting at least some of several requirements. Some of the such requirements include minimizing the testing time, reducing power dissipation during test time, etc. Reducing the testing time generally leads to corresponding lower costs since the usage of testing equipment (and labor type overhead) is reduced. Reduction of power dissipation is of concern since substantially more power dissipation can occur in test mode compared to functional mode, and integrated circuits may be designed with a power dissipation specification corresponding to only the functional mode.

What is therefore needed is a scan test model for testing integrated circuit with reduced power, time and/or cost.

BRIEF DESCRIPTION OF THE DRAWINGS

The present invention will be described with reference to the following accompanying drawings, which are described briefly below.

FIG. 2A is a block diagram illustrating the manner in which each sub-portion (sub-chip or module) of a module is tested comprehensively in a prior approach.

FIG. 2B is a block diagram illustrating the manner in which inter-portion tests are performed in a prior approach.

FIG. 3 is a flowchart illustrating the manner in which a device/system/integrated circuit can be tested comprehensively according to an aspect of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of present invention enables testing of integrated circuits which can be at least logically be viewed as containing multiple portions connected by interface logic. In an embodiment, each of such portions is tested individually using sequential scan techniques, which detects any intra-portion faults (i.e., faults within the portion).

The inter-portion (interface logic) faults are detected by forming a scan chain containing (a) the memory elements in the fan-out of the inputs to each sub-chip, (b) the memory elements in the fan-in of the outputs of each sub-chip, (c) memory elements connected to combinatorial logic propagating data inputs to the memory elements of (a), and (d) memory elements connected to provide control signals to (a), (b) and (c). Sequential scan tests are performed on the formed scan chain to test the inter sub-chip interface logic.

Due to such intra-portion testing and inter-portion testing, the integrated circuit may be tested comprehensively, as generally desired. In addition, by using substantially fewer memory elements than those present in the portions, the length of the scan chain is substantially reduced, which leads to reduction in test time and reduced power dissipation.

Another aspect of the present invention provides a convenient approach using which the memory cells can be connected to provide appropriate scan chains for both intra-portion tests and inter-portion tests. The memory elements needed for the inter-portion testing are identified, and a scan chain of the elements is formed.

For each portion, a scan chain ("portion scan chain") is formed from the memory elements (of the portion) excluding the memory elements ("isolation memory elements") which are part of the inter-portion scan chain. The isolation memory elements of the inter-portion scan chain are then added to the portion scan chain as would be desirable. By including the isolation memory elements as consecutive elements (forming a sub-chain), the same sub-chain is conveniently used in both inter-portion and intra-portion testing.

Figure 1:
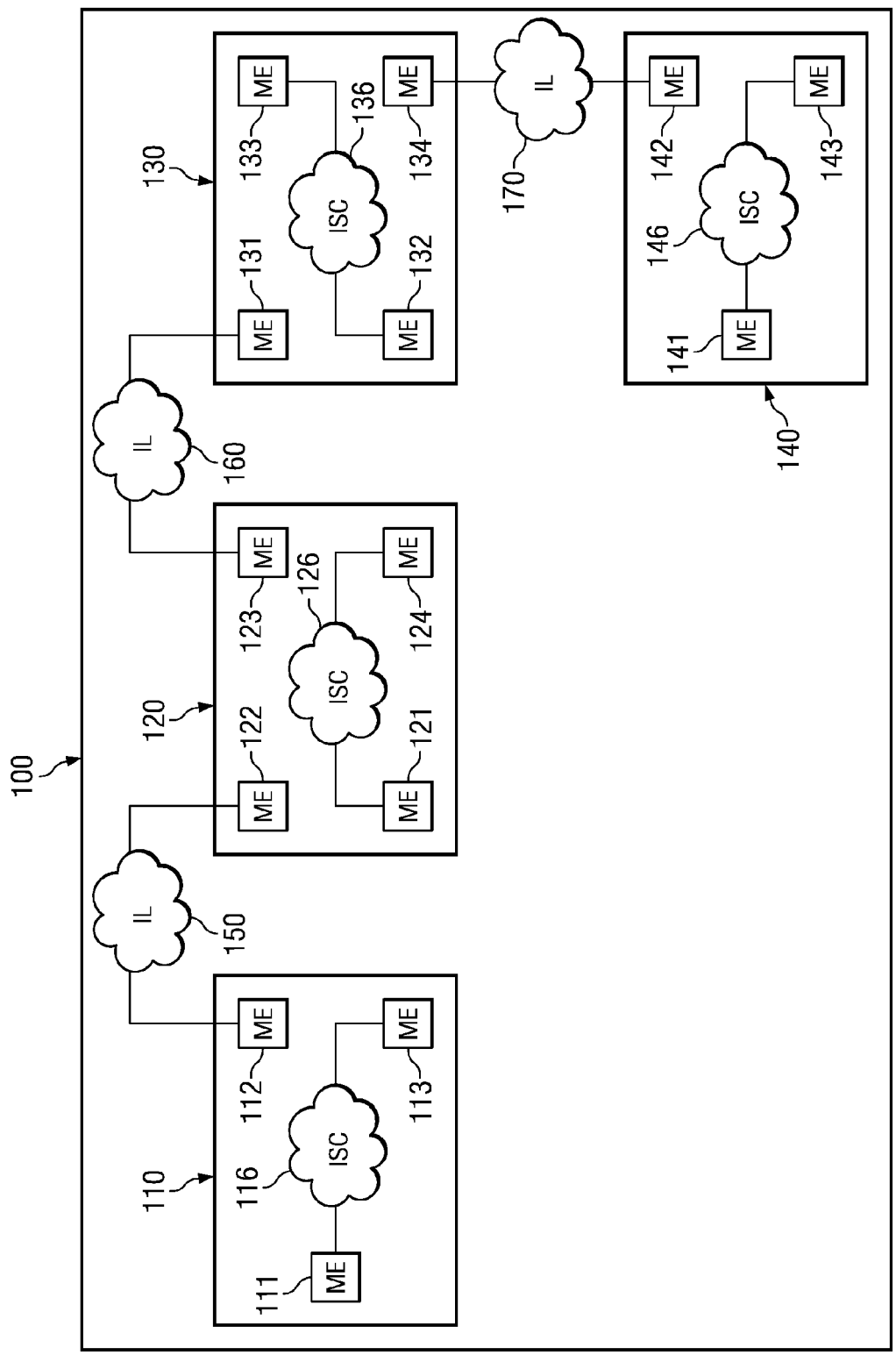
FIG. 1 is a block diagram illustrating the details of an integrated circuit, in which various aspects of the present invention can be implemented.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention 2. Example Environment FIG. 1 is a block diagram illustrating the details of an example integrated circuit in which various aspects of the present invention can be implemented. Integrated circuit 100 is shown containing sub-chips 110, 120, 130 and 140, and interface logics (IL) 150, 160 and 170. Each block is described in further detail below.

Sub-chips 110, 120, 130, and 140 (examples of portions) are respectively shown containing memory elements (ME) 111-113, 121-124, 131-134 and 141-143. Similarly, sub-chips 110, 120, 130, and 140 are respectively shown containing intra sub-chip circuits (ISC) 116, 126, 136 and 146. The memory elements store the digital value received on the corresponding input terminal at a particular time instance (rising/falling edge of a clock) and presents the stored digital value as output on the occurrence of following time instance. The intra sub-chip circuit 116 performs desired logic operation of the signal received on the input and provides the result to the corresponding memory elements. Description is provided with respect to sub-chip 110 only for conciseness.

Interface logics 150, 160 and 170 respectively provide interface between the sub-chips 110-120, 120-130, and 130-140. Interface logic 150 receives an input from memory element 112 (contained in sub chip 110) and performs a desired logi/timing operation. Result of the operation is provided as input to the memory element 122 (contained in sub chip 120). Interface logic 150, 160 and 170 potentially may receive multiple inputs from different sub-chips and may perform different logic operation on the received input. Results from the different logic operations are provided as input to multiple sub-chips.

Sequential scan techniques provided according to an aspect of present invention, use reduced length of scan chains for a comprehensive testing of integrated circuit 100 with a desired level of controllability and observability. As a result, reduction of test time, cost and power dissipation for testing an integrated circuit are achieved.

Various aspects of the present invention will be clearer in comparison to a prior approach in which at least some features of the present invention are not implemented. Accordingly, the details of such a prior system are described below first.

3. Prior Scan Based Testing Techniques

A sequential scan technique provided for testing an integrated circuit in one prior embodiment is illustrated below with respect to FIGS. 2A and 2B. Integrated circuit 200 is shown containing sub-chips 210, 230, 250 and 270. Scan chains 220, 240, 260 and 280 contain memory elements from the corresponding sub-chips 210, 230, 250, and 270, and the data in each of the scan chains is scanned in from pin/path 201 and scanned out from path/pin 299. The manner in which integrated circuit 200 is tested is described below.

The internal logics of each sub chip is tested using corresponding scan chain and scan vectors. As a results faults within sub-chips are determined. For example, assuming sub chip 210 contains memory element 111, 112, 113 and intra sub-chip circuit 116 (similar to sub-chip 110), sequential tests on scan chain 220 containing memory elements 111, 112, and 113 detect the faults in intra sub-chip 210. Description is continued with respect to manner in which inter sub-chip faults are detected in the prior approach.

FIG. 2B illustrates manner in inter- sub-chip faults are detected. Path 290 represents a scan chain obtained by combining the independent scan chains of all the sub-chip (generating scan chain containing memory elements from the entire design). In order to test inter sub-chip logics of an integrated circuit, a scan vector having larger number of bits (corresponding to length of the scan chain 290) is sequentially scanned in, and corresponding result bits are scanned out of scan chain 290.

One problem with the above approach is that the number of memory elements in scan chain 290 are used only to propagate scan vector and not contributing (participating) to determine desired fault. Due to the inclusion of non-contributing memory elements, power, test time and cost of testing is increased. Such results are often undesirable, as noted above in the background section. Various aspect of present invention overcome at least some of the disadvantages as described below in further detail.

4. Testing Integrated Circuits

FIG. 3 is a flow chart illustrating the manner in which an integrated circuit containing multiple portions (with corresponding applicable interface logics) can be tested according to an aspect of the present invention. The flowchart is described below with respect to FIG. 1 merely for illustration. The flow-chart can be implemented in other environments also, without departing from the scope and spirit of various aspects of the present invention, as will be apparent to one skilled in the relevant arts. The flow chart begins in step 301 and control immediately passes to step 310.

In step 310, sub-chips 110, 120, 130 and 140 (or portions, in general) are tested individually using a sequential scan technique. The sub-chips can be tested in parallel (independently) or in sequence (e.g., as in FIG. 2A above).

In step 320, a scan chain containing (a) the memory elements receiving output values from the interface modules, (b) the memory elements providing input values to interface modules, (c) memory elements connected to the input pins of the logic gates providing input values to interface modules, and (d) memory elements providing the control signal to memory elements of (a), (b) and (c) the sub-chips, is formed.

In step 330, sequential scan tests are performed to test interface logic (150, 160, and 170) using the scan chain formed in step 320. The flow chart ends in step 399.

As may be appreciated from the description below with respect to FIG. 4, the interface logics 150 160, and 170 would be tested adequately due to the inclusion of the memory element of step 320. In addition, as the memory elements represent a substantially smaller set of elements compared to the number of elements selected by the approach of Fig. 2B, the length of scan chain is considerably reduced. As a result, power consumption, time and/or cost may be reduced.

The description is continued with respect to an example which illustrates the manner in which step 320 can be performed.

5. Selecting Memory Elements for Inter-portion Testing

Figure 4:
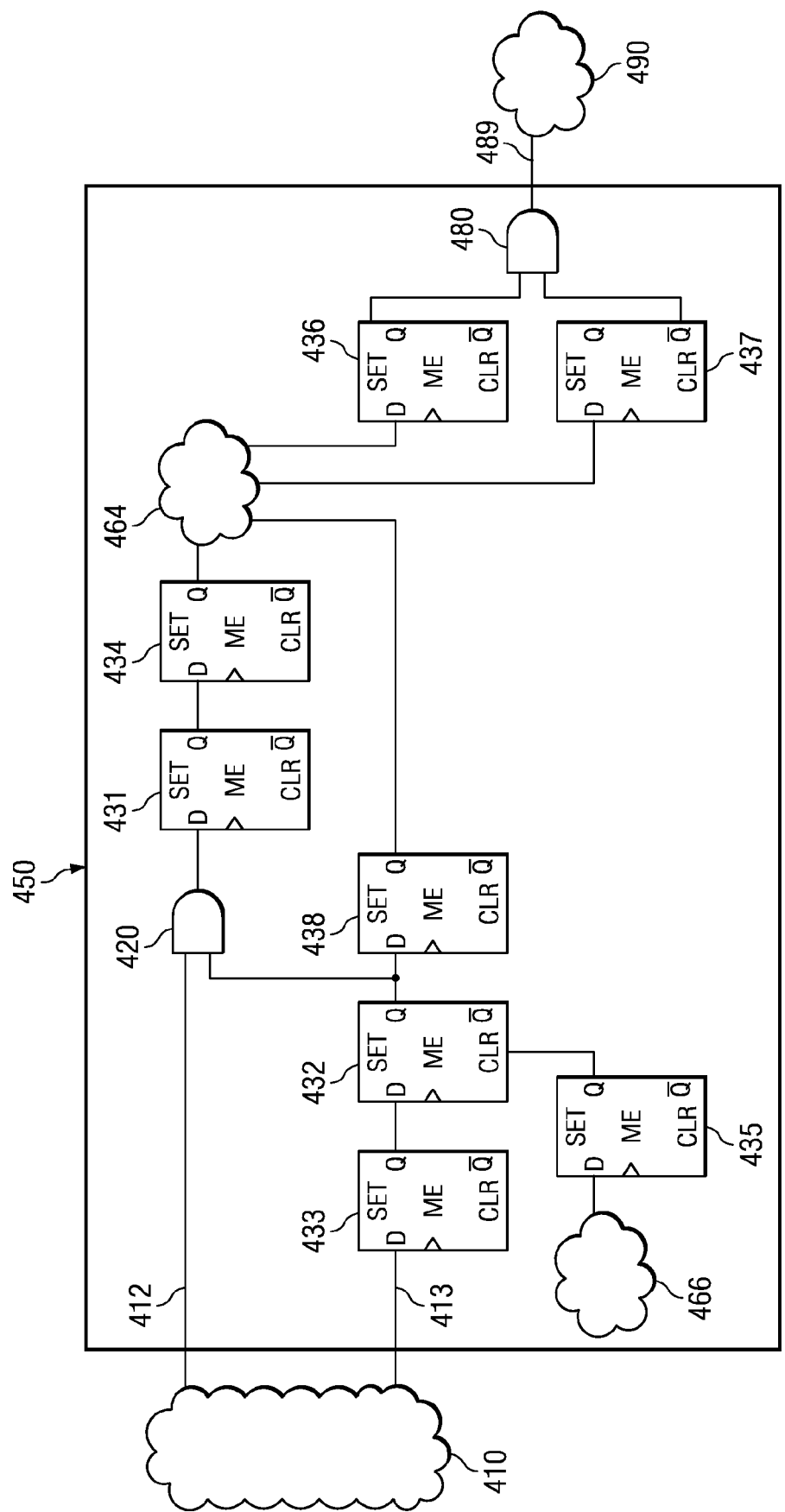
FIG. 4 is circuit diagram illustrating the manner in which memory elements are selected for inter-portion testing in an embodiment of the present invention.

FIG. 4 illustrates the manner in which step 320 can be performed. The block diagram there illustrates the details of a portion of integrated circuit containing an example sub-chip 450, and interface logics 410 and 490. Sub-chip 450 is shown containing AND gates 420 and 480, memory elements (flip-flops) 431-438, and combinational circuits 464 and 466. Each block is described below in further detail.

Interface logic 410 provides two input signals to sub-chip 450 on paths 412 and 413 respectively. Interface logic 490 receives a digital value on path 489 from sub-chip 450. Interface logic 410 receives digital value from number of sub-chips(not shown) and performs various digital operations on the received digital values. The result of the operation is provided as input to the sub-450. Similarly interface logic 490 receives inputs from sub-chip 450 and provides an output to number of sub-chips(not shown).

Sub-chip 450 receives inputs from interface logic 410 on path 412 and 413, and presents one input to a terminal of AND gate 420 and another input to a terminal of memory element 433. Sub-chip 450 performs various digital operations on the received inputs and provides an output on path 489.

AND gate 420 performs a logical AND operation of an input signal received on path 412 and the output of flip-flop 432, and provides the result to flip-flop 431. Similarly, AND gate 480 performs a logical AND operation on output of flip-flops 436 and 437, and provides the result on path 489 as output of sub-chip 450. The output of flip-flop 435 is connected to the enable input of flip-flop 432, and thus controls the operation of flip-flop 432.

The manner in which various memory elements of a sub-chip are selected for testing the inter sub-chip faults is described below in further detail.

Flip-flops 431 and 433 receive digital value from the interface logic 410, and are thus in the fan-out path of the input pins. Accordingly, with respect to (a) in step 320, flip-flops 431 and 433 are selected.

The output of flip-flops 436 and 437 generates a digital value provided to interface logic 490, and are thus is in the fan-in path of output path 489. Accordingly, with respect to (b) in step 320, flip-flops 436 and 437 are selected.

The output of flip flop 432 is connected to the data input of memory element 431 (already selected as a part of (a)), and thus flip flop 432 is selected with respect to (c) in step 320.

The output of the flip flop 435, is connected to reset input (a control pin) of flip flop 432 (already selected as a part of (c), as noted above). Accordingly, flip-flop 435 is selected, with respect to (d) in step 320.

A scan chain is generated containing all the selected flip-flops and a sequential scan technique is performed on the scan chain to perform inter-portion testing. It should be understood that the memory elements thus selected forms an optimum set of memory elements (even though more memory elements can be included in the scan chain for inter-portion testing, according to an aspect of the present invention) for testing, as described below in further detail.

6. Optimality of the Selected Memory Elements

It may be appreciated that each memory element selected in accordance with step 320 would perform at least one of the below tasks, and thus is a suitable candidate for inclusion in the inter-module testing scan chan:

control the subchip output (part (a) ("control flop");
observe the subchip input (part (b) ("observe flop");
aid in propagating the fault from input/output to the control/observe flop (part (c)); or
Control signals (enable, etc.) of control/observe flops The memory elements selected in accordance with step 320 would also detect the behavior of memory elements which control the subchip output, observe the subchip input, aid in propagating the fault from input/output to the control/observe flop, and/or to control the control signals of control/observe flop.

Accordingly, by including at least the memory elements in accordance with step 320, adequate inter-portion testing may be performed. In combination with testing each portion comprehensively, the entire integrated circuit may be tested comprehensively to a desired degree.

Another aspect of the present invention provides an efficient approach to connecting the memory elements such that scan chains are supported for both the inter-portion testing and intra-portion testing.

7. Connecting Flip-flops and Testing

Figure 5:
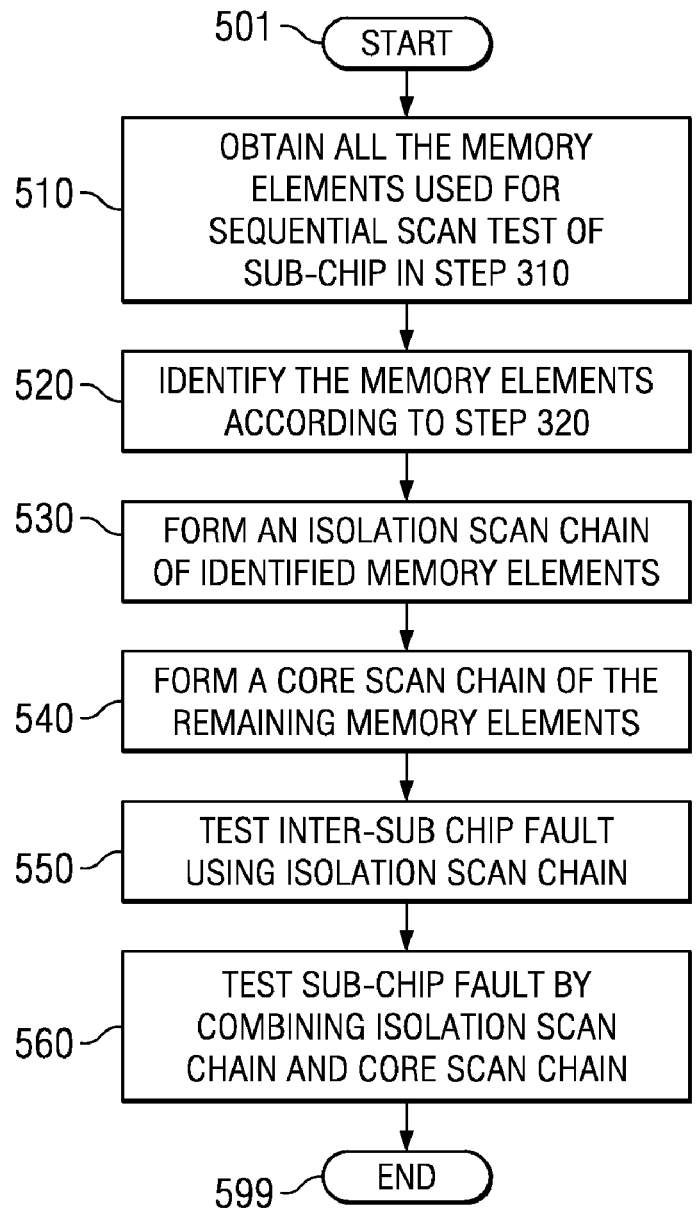
FIG. 5 is a flowchart illustrating the manner in which memory elements are connected as scan chains to facilitate intra-portion testing as well as inter-portion testing in an embodiment of the present invention.
Figure 6:
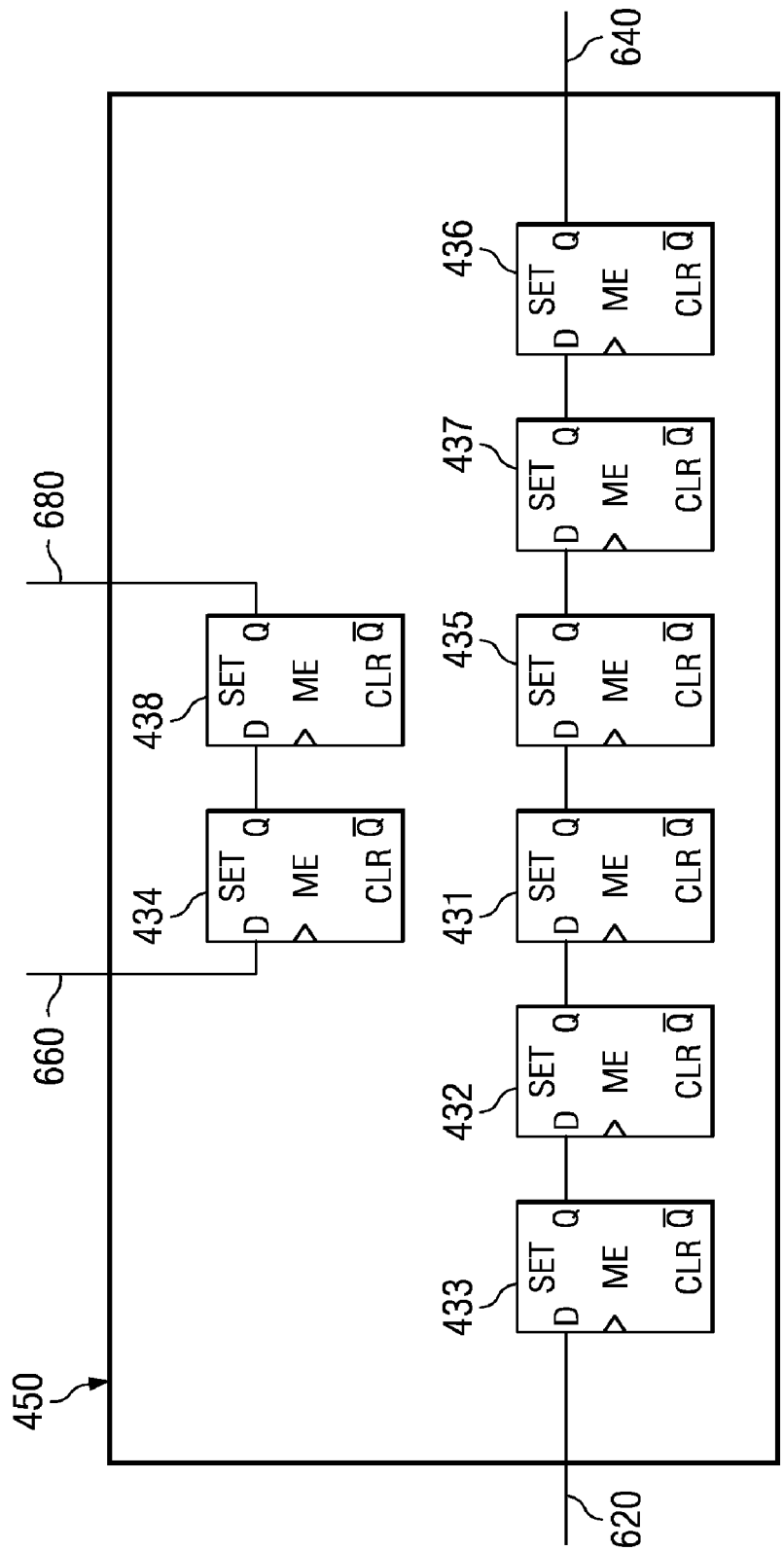
FIG. 6 is a circuit diagram illustrating the manner in which memory elements are connected as scan chains to facilitate intra-portion testing as well as inter-portion testing in an embodiment of the present invention.

FIG. 5 is a flow chart illustrating manner in which scan chain containing selected memory elements are generated and the generated scan chains are used for detecting inter sub-chip faults and intra sub-chip-faults according to an aspect of present invention. The flow-chart is described with reference to FIGS. 4A, 4B and 6 for illustration. The flow chart begins in step 501 and control immediately passes to step 510.

In step 510, a CAD (computer aided design) tool receives all the memory elements used for sequential scan test of sub-chip in step 310. Thus, information indicating the memory elements of FIG. 4 and the inter-connections in the functional mode, may be received. The information may be contained in a net list of the entire integrated circuit sought to be tested.

In step 530, the CAD tool identifies the memory elements according to step 320. Elements connected according to the specification of step 320 can be identified by examining a net list in a known way. Thus, memory elements 431, 432, 433, 435, 436 and 437 of FIG. 4 may be identified in step 530.

In step 540, the CAD tool forms an isolation scan chain of identified memory elements. A scan chain is generated using the identified elements with a scan in input of a memory element being connected to the and scan out pin of a prior memory element in the chain, and may be performed using known techniques. Thus, the isolation scan chain is shown containing memory elements 433, 432, 431, 435, 437 and 436 in that order, with the input being received on path 620 and output being generated on path 640.

In step 550, the CAD tool forms a core scan chain of the remaining memory elements (core scan chain). Step 550 may also be performed similar to step 540. Thus, the core scan chain is shown containing memory elements 434 and 438 in that order, with the input being received on path 660 and the output being provided on path 680.

In step 580, a testing device tests inter-sub chip (to inter-portion) faults using the isolation scan chain. Automatic test pattern generation (ATPG) techniques may be used to generate the test patterns. While performing test for locating inter sub-chip fault the memory elements in the core scan elements can be disabled (to reduce power consumption).

In step 590, the testing device tests sub-chip fault by combining isolation scan chain and core scan chain. Combining isolation scan chain with core scan chain can be performed by connecting scan out (e.g., path 640) of isolation scan chain terminal to scan in terminal (path 660) of the core scan chain. The scan vector for testing the intra sub-chip fault is scanned in through scan in terminal (620) of isolation scan chain and scanning out the result through scan out terminal (680) of the core scan chain.

While the above description is provided for a simple subchip, it should be understood that the approach can be extended to complex scenarios where different portions are tested in parallel. The CAD tool noted above (performing other tasks as well) may be implemented in a digital processing system as described below.

8. Digital Processing System

Figure 7:
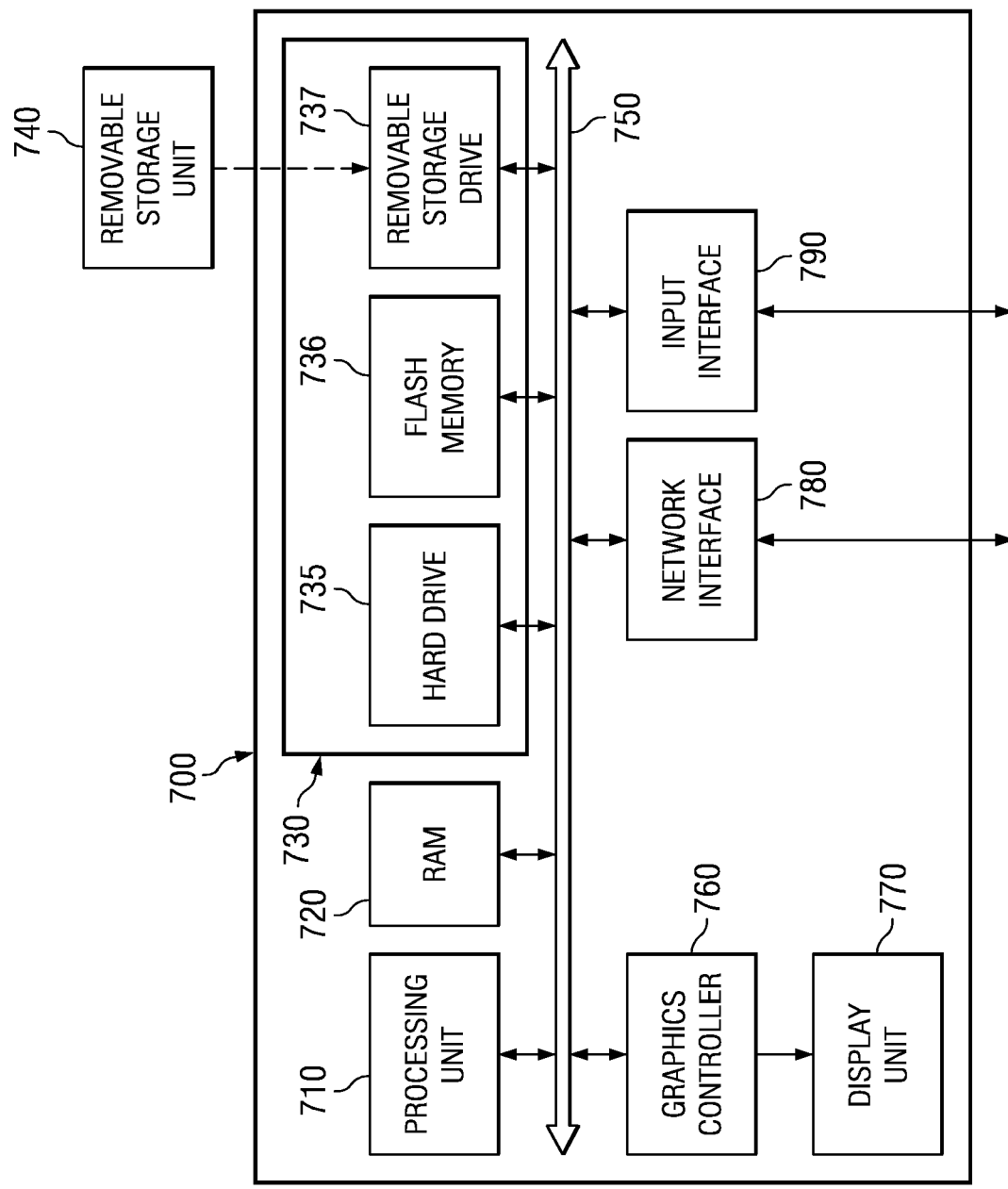
FIG. 7 is a block diagram illustrating the details of a digital processing system in which various aspects of the present invention are operative by execution of software instructions.

FIG. 7 is a block diagram of computer system 700 illustrating an example system for implementing the CAD tool noted above. Computer system 700 may contain one or more processors such as central processing unit (CPU) 710, random access memory (RAM) 720, secondary memory 730, graphics controller 760, display unit 770, network interface 780, and input interface 790. All the components except display unit 770 may communicate with each other over communication path 750, which may contain several buses as is well known in the relevant arts. The components of FIG. 7 are described below in further detail.

CPU 710 may execute instructions stored in RAM 720 to provide several features of the present invention. For example, the CAD tool may examine the digital representation (e.g., Netlists, well known in the relevant arts) to perform various steps of FIG. 5, provide for (e.g., by automatically suggesting/including the various connections, as would be desired) connecting the scan chains as described above.

CPU 710 may contain multiple processing units, with each processing unit potentially being designed for a specific task. Alternatively, CPU 710 may contain only a single processing unit. RAM 720 may receive instructions from secondary memory 730 using communication path 750.

Graphics controller 760 generates display signals (e.g., in RGB format) to display unit 770 based on data/instructions received from CPU 710. Display unit 770 contains a display screen to display the images defined by the display signals. Input interface 790 may correspond to a key-board and/or mouse, and generally enables a user to provide inputs. Network interface 780 enables some of the inputs (and outputs) to be provided on a network. In general, display unit 770, input interface 790 and network interface 780 enable a user to design an integrated circuit.

Secondary memory 730 may contain hard drive 731, flash memory 736 and removable storage drive 737. Secondary storage 730 may store the software instructions (which perform the actions specified by various flow charts above) and data (e.g., topology of the modules, cell libraries and determined EM and IR drop values corresponding to each path), which enable computer system 700 to provide several features in accordance with the present invention.

Some or all of the data and instructions may be provided on removable storage unit 740, and the data and instructions may be read and provided by removable storage drive 737 to CPU 710. Floppy drive, magnetic tape drive, CD-ROM drive, DVD Drive, Flash memory, removable memory chip (PCMCIA Card, EPROM) are examples of such removable storage drive 737.

Removable storage unit 740 may be implemented using medium and storage format compatible with removable storage drive 737 such that removable storage drive 737 can read the data and instructions. Thus, removable storage unit 740 includes a computer readable storage medium having stored therein computer software and/or data. An embodiment of the present invention is implemented using software running (that is, executing) in computer system 700.

In this document, the term "computer program product" is used to generally refer to removable storage unit 740 or hard disk installed in hard drive 731. These computer program products are means for providing software to computer system 700. As noted above, CPU 710 may retrieve the software instructions, and execute the instructions to provide various features of the present invention.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of testing an integrated circuit containing a plurality of portions connected by corresponding interface logics, each of said plurality of portions containing a corresponding plurality of memory elements, said method comprising:

performing intra-portion testing of each of said plurality of portions separately using sequential scan techniques;

forming an inter-portion scan chain containing a set of memory elements, wherein said set of memory elements is less than said plurality of memory elements, said set of memory elements containing (a) memory elements in the fan-out of the inputs to each of said plurality of portions, (b) memory elements in the fan-in of the outputs of each of said plurality of portions, (c) memory elements connected to combinatorial logic propagating data inputs to the memory elements of (a), and (d) memory elements connected to provide control signals to (a), (b) and (c); and performing testing on said inter-portion scan chain using sequential scan techniques to test inter portion logic including said interface logics.

2. The method of claim 1, wherein said sequential scan techniques comprises Automatic test pattern generation (ATPG).

3. The method of claim 2, wherein said performing intra-portion testing comprises:

forming a first scan chain of said plurality of memory elements of a first portion, wherein said first portion is contained in said plurality of portions, said first scan chain containing a first sub-chain and a second sub-chain, wherein elements in first sub-chain are connected in sequence and elements in said second sub-chain are also connected in sequence, wherein said first sub-chain contains the memory elements of said first portion contained in said inter-portion scan chain, and said second sub-chain contains the remaining elements of said plurality of memory elements of said first portion, wherein said first sub-chain is connected to said second sub-chain in said intra-portion testing of said first portion using sequential scan techniques.

4. The method of claim 2, wherein said first portion comprises a sub-chip.

5. An integrated circuit designed for testing by sequential scan techniques, said integrated circuit comprising:

a plurality of portions connected by corresponding interface logics, each of said plurality of portions containing a corresponding plurality of memory elements;

a set of memory elements being designed to be connected in an inter-portion scan chain, wherein said set of memory elements is less than said plurality of memory elements, said set of memory elements containing (a) memory elements in the fan-out of the inputs to each of said plurality of portions, (b) memory elements in the fan-in of the outputs of each of said plurality of portions, (c) memory elements connected to combinatorial logic propagating data inputs to the memory elements of (a), and (d) memory elements connected to provide control signals to (a), (b) and (c), wherein said set of memory elements connected in said inter-portion scan chain are designed for inter-portion testing of said plurality of portions using sequential scan techniques, each of said plurality of memory elements being connected as corresponding scan chains for intra-portion testing.

6. The integrated circuit of claim 5, wherein said sequential scan techniques comprises Automatic test pattern generation (ATPG).

7. The integrated circuit of claim 5, wherein said plurality of portions comprises a first portion, wherein said plurality of memory elements of said first portion are formed as a first scan chain, said first scan chain containing a first sub-chain and a second sub-chain, wherein elements in said first sub-chain are connected in sequence and elements in said second sub-chain are also connected in sequence, wherein said first sub-chain contains the memory elements of said first portion contained in said inter-portion scan chain, and said second sub-chain contains the remaining elements of said plurality of memory elements of said first portion, wherein said first sub-chain is connected to said second sub-chain in said intra-portion testing of said first portion using sequential scan techniques.

8. The integrated circuit of claim 7, wherein said first portion comprises a sub-chip.

* * * * *